United States Patent [19]
Gutsell, Jr. et al.

[11] Patent Number: 4,737,437
[45] Date of Patent: Apr. 12, 1988

[54] LIGHT SENSITIVE DIAZO COMPOUND, COMPOSITION AND METHOD OF MAKING THE COMPOSITION

[75] Inventors: Erwin S. Gutsell, Jr., North Muskegon; Louis C. Cohen, Cedar Springs, both of Mich.

[73] Assignee: East Shore Chemical Co., Muskegon, Mich.

[21] Appl. No.: 844,825

[22] Filed: Mar. 27, 1986

[51] Int. Cl.$^4$ .................. G03C 1/54; C07C 113/00
[52] U.S. Cl. .................. 430/168; 430/192; 430/193; 534/557
[58] Field of Search .................. 430/193, 192, 168; 534/557, 556

[56] References Cited

U.S. PATENT DOCUMENTS

| | | |
|---|---|---|
| 3,046,116 | 7/1962 | Schmidt . |
| 3,046,118 | 7/1962 | Schmidt . |
| 3,046,121 | 7/1962 | Schmidt . |
| 3,106,465 | 10/1963 | Neugebauer et al. .............. 430/193 |
| 3,148,983 | 9/1964 | Endermann et al. . |
| 3,188,210 | 6/1965 | Fritz et al. .............. 430/193 |
| 3,201,239 | 8/1965 | Neugebauer et al. .............. 430/193 |
| 3,402,044 | 9/1968 | Steinhoff et al. . |
| 3,640,992 | 2/1972 | Sus et al. .............. 430/193 |
| 3,950,173 | 4/1976 | Ross et al. .............. 430/193 |
| 4,266,000 | 5/1981 | Stahlhofen et al. .............. 430/193 |
| 4,309,500 | 1/1982 | Shishido . |
| 4,474,864 | 10/1984 | Chow et al. . |
| 4,522,911 | 6/1985 | Clecak et al. . |
| 4,543,319 | 9/1985 | Chao et al. . |

FOREIGN PATENT DOCUMENTS 147596 7/1985 European Pat. Off. .

*Primary Examiner*—Charles L. Bowers, Jr.
*Attorney, Agent, or Firm*—Price, Heneveld, Cooper, DeWitt & Litton

[57] ABSTRACT

The specification discloses photosensitizers comprising esters of 1-oxo-2-diazo-naphthalene sulfonic acid and 4-benzyl-1,2,3-trihydroxybenzene, photo resists based thereon and methods for making the necessary intermediates and final products.

6 Claims, 2 Drawing Sheets

1-oxo-2-diazo-naphthalene-5-sulfonic acid ester of 4-benzyl-1,2,3-trihydroxybenzene at 25 mg/l A = Unbleached
B = Bleached
X - Artifact generated by the optics in the spectrophotometer

LIGHT SENSITIVE DIAZO COMPOUND, COMPOSITION AND METHOD OF MAKING THE COMPOSITION

BACKGROUND OF THE INVENTION

The present invention relates to photolithographic compounds and methods, and specifically to photosensitizers used in lithographic resists. Basically, photolithography comprises applying a thin coating of resist material, exposing the resist through a mask such that light energy strikes selected areas of the resist and then developing the resist. Development involves washing away either the exposed resist, where a positive tone resist is used, or washing away the unexposed portion of the resist where a negative tone resist is used. This technology has been used in the printing industry for many years, and has been used more recently in the manufacture of semiconductor devices.

Positive tone resists are gradually becoming the most important of the two type of resists because of the higher resolution and thermostability that positive resists offer. They also provide greater resistance to dry etching environments. Positive resists comprise a matrix resin into which is blended a photosensitizer. The matrix resin is usually a copolymer of phenol and formaldehyde, more specifically a mixture of cresols and formaldehyde, the generic term for this class of polymers being novolak. Novolak resins are soluble in common organic solvents and aqueous base solutions.

The photosensitizers used in positive tone resists are substituted diazo compounds. Suitable diazo compounds act as dissolution inhibitors for aqueous base development of the novolak resin. Films of novolak containing 15 to 20% by weight of a diazo-naphthoquinone sensitizer dissolve orders of magnitude more slowly in aqueous base solution than films of novolak alone. When the diazo compound is exposed to light on the other hand, it undergoes a series of reactions that culminate in the formation of an indene carboxylic acid. This photo product, unlike its precursor, is extremely soluble in aqueous base by virtue of the carboxylic acid functionality. Complete photo decomposition of the sensitizer results in a dissolution rate for the resin/sensitizer blend that is equal to or greater than the intrinsic dissolution rate of the novolak matrix resin alone. This photochemically generated difference in dissolution rate in aqueous base is exploited in the generation of relief images.

One class of diazo compound which have been widely used as lithographic photosensitizers are hydroxy compounds condensed with 1-oxo-2-diazo-naphthalene-sulfonic acid chlorides (diazo-naphthoquinone-sulfonyl chloride), with the sulfonic group typically occupying the 4 or 5 position. Generally speaking, the bigger the molecules of the hydroxy compounds condensed with the 1-oxo-2-diazo-naphthalene-sulfonic acid chloride are, the better suited are the resulting diazo-naphthoquinone-sulfonic acid esters. This is recognized in U.S. Pat. No. 3,046,121 to M. P. Schmidt, issued July 24, 1962. One specific hydroxy compound which has been very successfully used in diazo-naphthalene-sulfonic acid esters is trihydroxybenzophenone. Examples of diazo-naphthalene-sulfonic acid esters based on this compound are disclosed in U.S. Pat. No. 3,148,983 to Endermann et al. issued Sept. 15, 1964 and in U.S. Pat. No. 3,402,044 to Steinhoff et al. issued Sept. 17, 1968.

One drawback to the foregoing diazo ester is that it does not work well where the light used to expose the resist is in the mid UV range. The development of higher circuit density in microelectronic devices has led to a desire for improved resolution of optical projection through the use of higher energy, shorter wavelength radiation than that currently employed in the near UV spectral region (350 to 450 nm). A reduction in the exposure wavelength from near UV to the 313 mm mid UV emission level would produce a substantial increase in resolution.

Unfortunately, the ester of trihydroxybenzophenone and 1-oxo-2-diazo-naphthalene-sulfonic acid does not substantially bleach in the mid UV light range when it is exposed to light. In other words, the bleached sensitizer continues to absorb a significant amount of mid UV radiation. This substantially slows the bleaching process in that the upper molecular layers tend to "shade" the lower molecular layers. The resist is thus slower when mid UV light is used to expose the resist.

SUMMARY OF THE INVENTION

The present invention is based on the discovery that improved photosensitivity to light in the mid UV range can be achieved using diazo esters of 4-benzyl-1,2,3-trihydroxybenzene. Further, these esters show surprising solubility in some novolak resin/solvent systems. These and other objects, advantages and features of the present invention will be more fully understood and appreciated by reference to the written specification and appended drawings.

DESCRIPTION OF THE PREFERRED EMBODIMENT

Introduction

Figure 1:
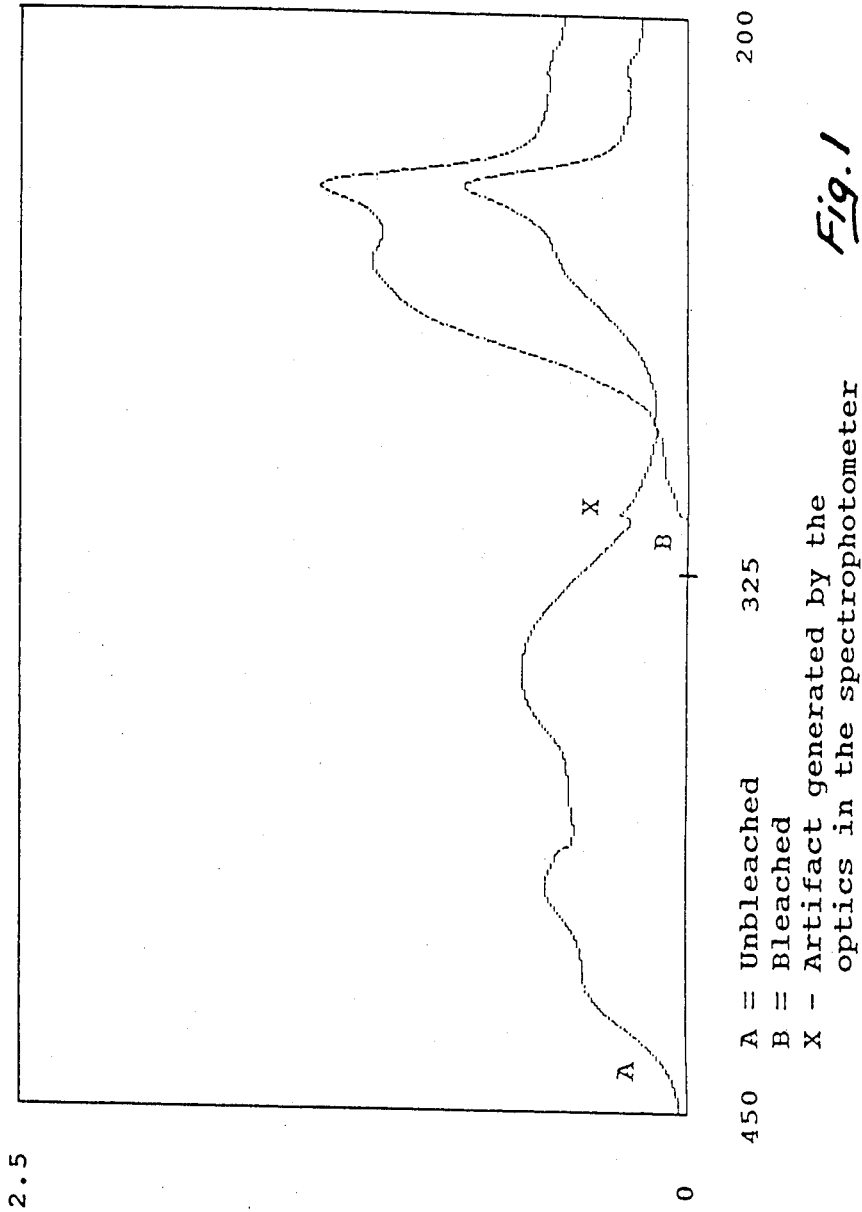
FIG. 1 shows the absorption spectrum for 1-oxo-2-diazo-naphthalene-5-sulfonic acid ester of 4-benzyl-1,2,3-trihydroxybenzene.

In the preferred embodiment, the photo resists of the present invention comprise a novolak resin matrix into which is dissolved the ester(s) of 4-benzyl-1,2,3-trihydroxybenzene and 1-oxo-2-diazo-naphthalene-x-sulfonic acid, where "x" is 4 or 5. The term "ester" as used herein is intended to encompass any of the variety of esters obtainable from this reaction, and mixtures thereof.

4-benzyl-1,2,3-trihydroxybenzene and its preparation 4-benzyl-1,2,3-trihydroxybenzene has the following structural formula:

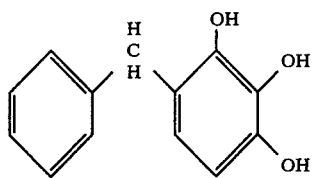

This novel product can be prepared by the hydrogenation of trihydroxybenzophenone in the presence of a palladium/carbon catalyst or a Raney nickel catalyst as illustrated below:

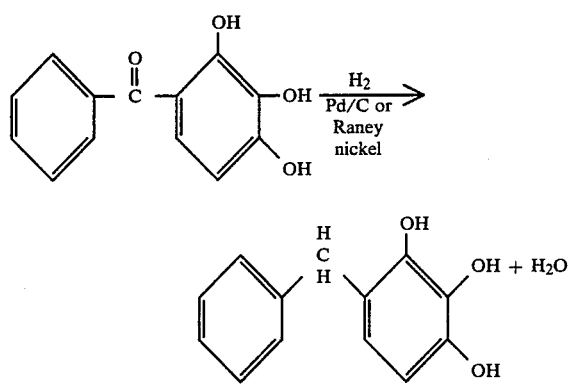

The inclusion of a trace amount of an amine hydrochloride such as methylamine hydrochloride promotes the above reaction specifically and minimizes the formation of undesirable by-products. As little as from about 0.01 to about 1% amine hydrochloride by weight of the trihydroxybenzophenone is sufficient.

The hydrogenation is carried out at lower pressures, e.g., about 50 psi. Suitable temperature ranges from about 50 to about 100 degrees C. The hydrogenation is allowed to continue for about 16 hours.

In one example, 30 grams of trihydroxybenzophenone were dissolved in 200 ml. of methanol along with 0.1 gram of methylamine hydrochloride and 2 grams of a palladium/carbon catalyst. The palladium comprised approximately 5% of the palladium/carbon gross weight. This mixture was subjected to hydrogenation at 50 psi and 50 degrees C. for 16 hours. The reaction took up 14.5 psi versus a theoretical 13.9 (based on 2 moles of hydrogen per mole of trihydroxybenzophenone). After 16 hours, the mixture was filtered to remove the catalyst and concentrated on a rotary evaporator. As a precaution, the resulting product was dissolved in 100 ml. of methylene chloride and concentrated again, in order to drive off residual methanol. Methanol would of course interfere with the subsequent esterification process.

Yet another approach to producing 4-benzyl-1,2,3-trihydroxybenzene would be to react benzyl chloride with 1,2,3-trihydroxybenzene in the presence of a Friedel-Crafts catalyst. That reaction would proceed basically as indicated below:

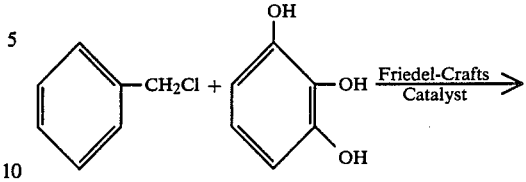

The Esters And Their Preparation

Photosensitizers based on 4-benzyl-1,2,3-trihydroxybenzene are prepared by reacting it with 1-oxo-2-diazo-naphthalene-x-sulfonic acid chloride, where "x" equals 4 or 5, and triethylamine. Mono, di or tri-esters are formed depending on the stoichiometric amount of the diazo compound. One tri-ester is possible, but three di-ester and three mono-ester isomers are possible. All are photoactive and typically, the reaction results in a mixture of these possible esters. The reaction of the 1-oxo-2-diazo-naphthalene-5-sulfonic acid chloride compound with 4-benzyl-1,2,3-trihydroxybenzene to form a tri-ester is illustrated below:

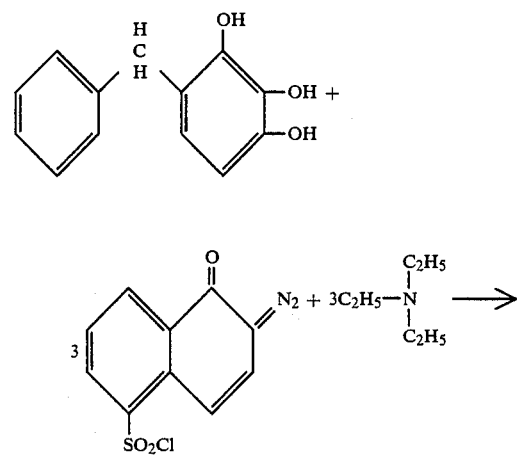

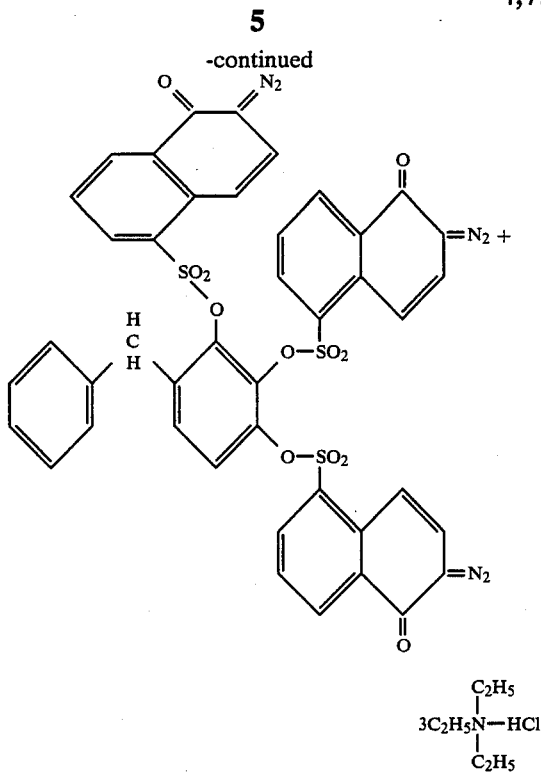

The reaction is carried out in methylene chloride. The reactants can be obtained either by evaporating the methylene chloride or by pouring the methylene chloride solution into heptane or some other solvent for the methylene chloride which does not dissolve the ester(s). The ester(s) then precipitates out.

In either process, one wants to avoid the formation of crystalline product. Crystalline product would be more difficult to dissolve in the resist resin/solvent matrix. Generally, this is no problem using the evaporation technique, since it results in the end product being more amorphous in character.

However when the precipitation process is used, one must take care (1) to inject the methylene chloride solution slowly into the heptane or like solvent and (2) to agitate the heptane vigorously during injection. This technique helps to insure that the ester has good solubility in the resist.

In one example, the 1-oxo-2-diazo-naphthalene-5-sulfonic acid ester of 4-benzyl-1,2,3-trihydroxybenzene was obtained by first dissolving 92.47 grams of 1-oxo-2-diazo-naphthalene-5-sulfonic acid chloride (0.3442 moles) and 27.56 grams of 4-benzyl-1,2,3-trihydroxybenzene (0.1275 moles) in 500 ml. of methylene chloride, a 2.7 to 1 molar ratio. To this, 37.27 grams of triethylamine (0.3683 moles, a slight molar excess) in 100 ml. of methylene chloride was added. This addition took place over a one hour period at 20 to 24 degrees C. The reaction was then held at that temperature for another 2¼ hours. 20 ml. of acetic or formic or other small chain carboxylic acid are then added and the product washed four times with 625 ml. of deionized water. The solution was then dried with 15.3 grams of anhydrous magnesium sulfate. 12.5 grams of carbon were added and the mixture stirred for three hours. It was filtered to remove the magnesium sulfate and carbon and the methylene chloride was then evaporated on a rotary evaporator.

In another example, a similar procedure was followed except that after filtration of the magnesium sulfate and carbon, the solution was dropped into 2200 ml. of heptane under vigorous agitation over a period of about one hour. The resulting precipitate was recovered by filtration. In both cases, the yield was approximately 95% of theoretical.

Following the procedures outlined above, samples were made at a ratio of 1-oxo-2-diazo-naphthalene-5-sulfonic acid chloride to 4-benzyl-1,2,3-trihydroxybenzene of 2.7, 2.05 and 1.86. All of the resulting esters provided satisfactory photosensitizers having applicability in the mid UV exposure range.

Other amines of sufficient base strength could be used in the reaction. They are preferred to conventional alkali basis since one avoids the introduction of undesirable alkali metal ions. Alkali metal bases, could be used, but the level of the alkali metal ions would have to be reduced using conventional technology before the product would be suitable for use in semi-conductor processing.

Similarly, other solvents could be used. For example, one could make the product in acetone, quench the reaction by mixing in water and filter the resulting product. Finally, the "4-" substituted sulfonyl chloride can also be used. The condensation reaction does proceed somewhat more slowly, but the end product is an effective photosensitizer.

The Photo Resist

The photo resist itself can employ any conventional novolak or equivalent resin dissolved in a conventional solvent. Since the photosensitizer of the present invention is particularly useful in the mid UV range, it is desirable to utilize a resin which also does not absorb light in the mid UV range. Poly(p-hydroxystyrenes) and resoles may be used, though novolak resins are preferred. One specific example of a suitable novolak is cresylic acid-formaldehyde resin.

Common casting solvents such as diglyme, ethyl cellosolve acetate and the like are used. The proportions of photosensitizer, resin and solvent will vary with specific system requirements. A photoeffective quantity of photosensitizer will be required, and this percentage will vary as a routine function of system design. Typical resists comprise from about 10 to about 30% photosensitizer, based on weight of the resin and photosensitizer, with 15 to 25% being more typical.

Experimental Results

Figure 2:
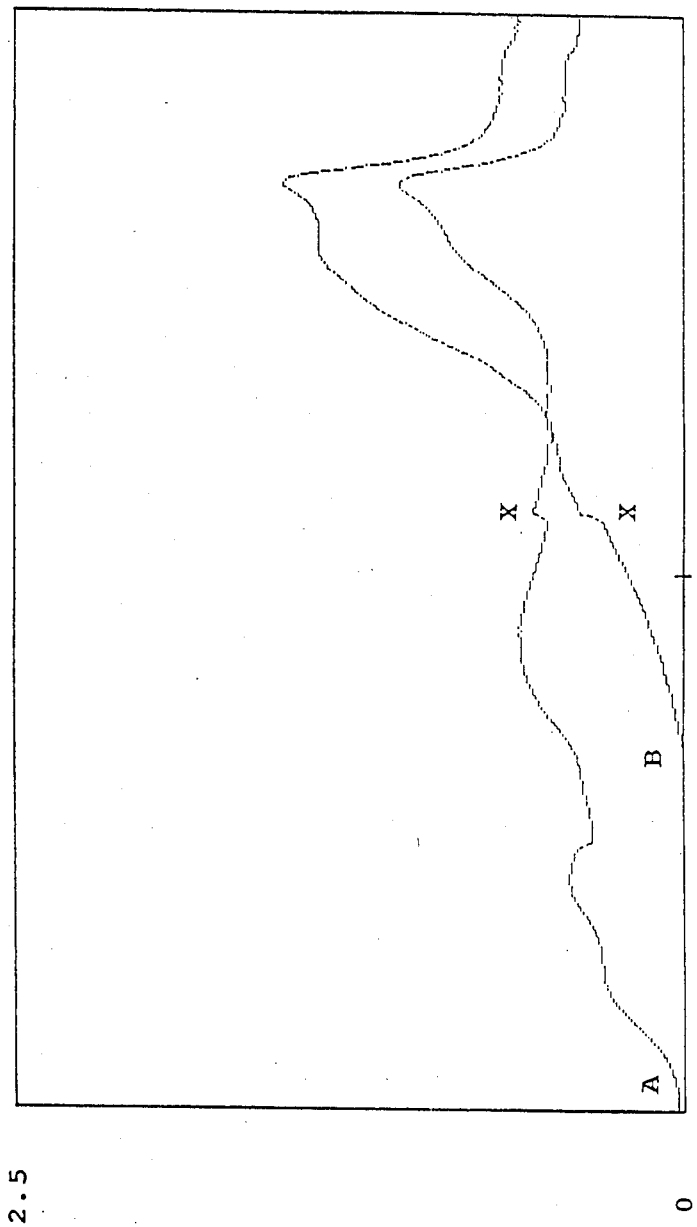
FIG. 2 shows the absorption spectrum 1-oxo-2-diazo-naphthalene-5-sulfonic acid ester of 2,3,4-trihydroxybenzophenone before and after bleaching.

The absorption spectrum for a diazo-naphthalene-sulfonic ester in accordance with the present invention, both bleached and unbleached can be compared to the bleached and unbleached absorption spectra for a diazo-naphthalene-sulfonic acid ester in accordance with the prior art by comparing FIGS. 1 and 2. In FIG. 1, a solution of 1-oxo-2-diazo-naphthalene-5-sulfonic acid ester of 4-benzyl-1,2,3-trihydroxybenzene was prepared at a concentration of 25 mg. per liter of solvent. Its absorption spectrum was measured from 200 nanometers to 450 nanometers. The solution was then bleached for five minutes by exposure to a broad spectrum light source and the absorption characteristics of the resulting bleached ester were also recorded in the range from 200 to 450 nanometers (FIG. 1). The same procedure was followed for 1-oxo-2-diazo-naphthalene-5-sulfonic acid ester of 2,3,4-trihydroxybenzophenone, and the results are charted in FIG. 2.

As can be seen by comparison of FIGS. 1 and 2, the photosensitizer in accordance with the present invention shows almost no absorption at a wavelength of 313 nanometers after bleaching. Indeed, FIG. 1 illustrates that the photosensitizer of the present invention is effective not only in the mid UV range, but also in the near UV range, i.e., approaching 450 nanometers. In contrast, the prior art photosensitizer (FIG. 2) shows considerable absorption at 313 nanometers even after bleaching. It is hence much less effective as a photosensitizer for exposure with mid UV light. The applicability of the present photosensitizer in near UV light, coupled with its surprising solubility in at least some novolak resin systems renders this an extremely desirable mid and near UV photosensitizer. Of course it is understood that the above is merely a preferred embodiment of the invention and that various changes and alterations can be made without departing from the spirit and broader aspects thereof as set forth in the appended claims.

The embodiments of the invention in which an exclusive property or privilege is claimed are defined as follows:

1. A photosensitizer comprising:
    a mixed ester of mono, di and tri-esters of 4-benzyl-1,2,3-trihydroxybenzene and 1-oxo-2-diazo-naphthalene-x-sulfonic acid, where "x" is 4 or 5.

2. A photoresist solution comprising:
    a solvent solution of a matrix resin and a photoeffective amount of a mixed ester of mono-, di- and tri-esters of 4-benzyl-1,2,3-trihydroxybenzene and 1-oxo-2-diazo-naphthalene-x-sulfonic acid, where "x" is 4 or 5.

3. The photo resist solution of claim 2 in which said matrix resin is a novolak resin.

4. A method for sensitizing a photo resist solution comprising a resin matrix comprising dissolving into the resist solution a photoeffective amount of a mixed ester of mono-, di- and tri-esters of 4-benzyl-1,2,3-trihydroxybenzene and 1-oxo-2-diazo-naphthalene-x-sulfonic acid, where "x" is 4 or 5.

5. A dry photo resist matrix comprising:
    an admixture of matrix resin and a photoeffective amount of a mixed ester of mono-, di- and tri-esters of 4-benzyl-1,2,3-trihydroxybenzene and 1-oxo-2-diazo-naphthalene-x-sulfonic acid, where "x" is 4 or 5.

6. The dry photo resist matrix of claim 5 in which said matrix resin is a novolak resin.

* * * * *

UNITED STATES PATENT AND TRADEMARK OFFICE
CERTIFICATE OF CORRECTION

PATENT NO. : 4,737,437
DATED : April 12, 1988
INVENTOR(S) : Erwin S. Gutsell, Jr. and Louis C. Cohen It is certified that error appears in the above-identified patent and that said Letters Patent is hereby corrected as shown below:

Column 2, line 16:

"mm" should be --nm--.

Signed and Sealed this

Eleventh Day of July, 1989

Attest:

DONALD J. QUIGG

Attesting Officer

Commissioner of Patents and Trademarks